(12) United States Patent
Anderson

(10) Patent No.: US 6,320,382 B1
(45) Date of Patent: Nov. 20, 2001

(54) ETCHED Z-AXIS GRADIENT COILS FOR MAGNETIC RESONANCE

(75) Inventor: Weston A. Anderson, Palo Alto, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 09/471,640

(22) Filed: Dec. 23, 1999

(51) Int. Cl.$^7$ ........................................... G01V 3/00
(52) U.S. Cl. ..................... 324/318; 324/309; 324/322
(58) Field of Search .................................. 324/318, 322, 324/300, 309; 335/296

(56) References Cited

U.S. PATENT DOCUMENTS

| 4,910,462 | 3/1990 | Roemer et al. | 324/318 |
| 5,623,208 | 4/1997 | Hasegawa | 324/318 |

*Primary Examiner*—Jay Ptidar
*Assistant Examiner*—Brij B. Shrivastav
(74) *Attorney, Agent, or Firm*—Edward H. Berkowitz

(57) ABSTRACT

A z-axis magnetic field gradient coil for nuclear magnetic resonance (NMR) spectrometry includes an etched double-sided flexible sheet having via connections running through the sheet. The vias interconnect two conductive patterns formed on opposite sides of the sheet. Each z-axis current lead is adjacent to another z-axis current lead oriented in the opposite direction, such that the z-axis current components of the two patterns cancel each other. The resulting net current component is in the x-y plane, and generates the desired z-axis magnetic field gradient.

6 Claims, 5 Drawing Sheets

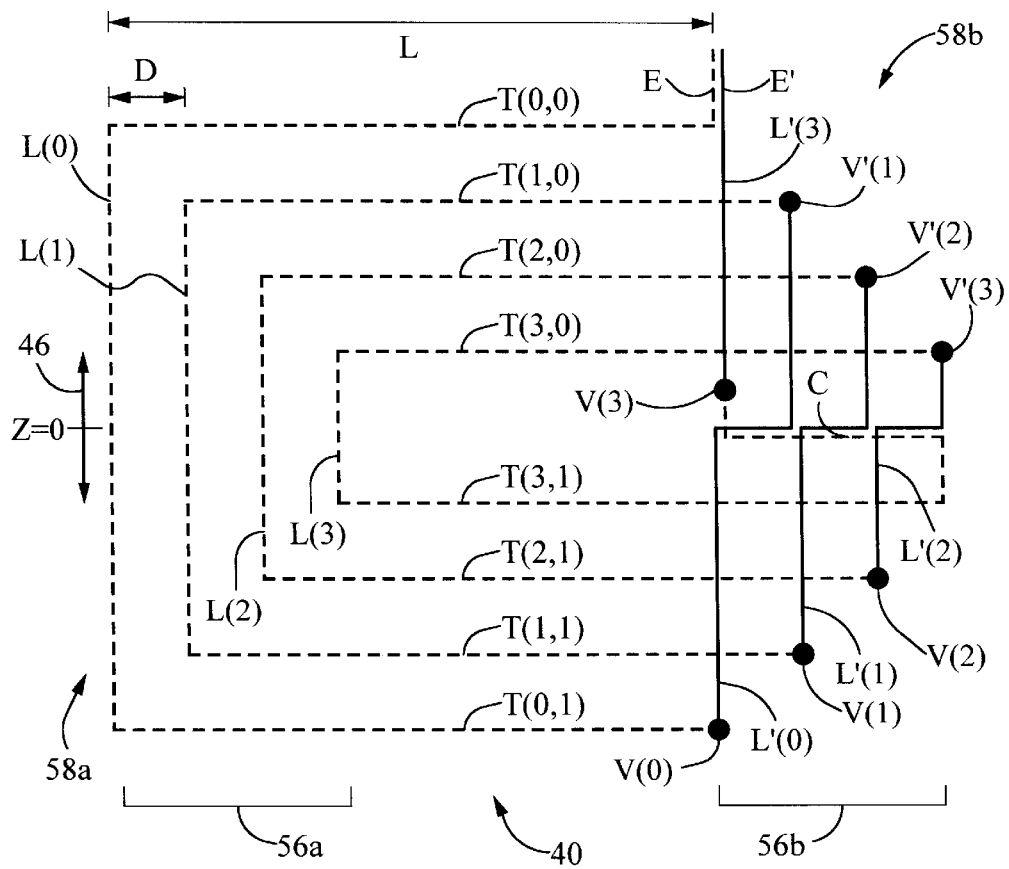
FIG. 1-A
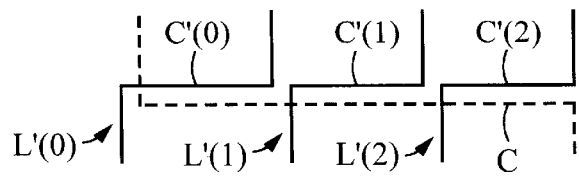
FIG. 1-B

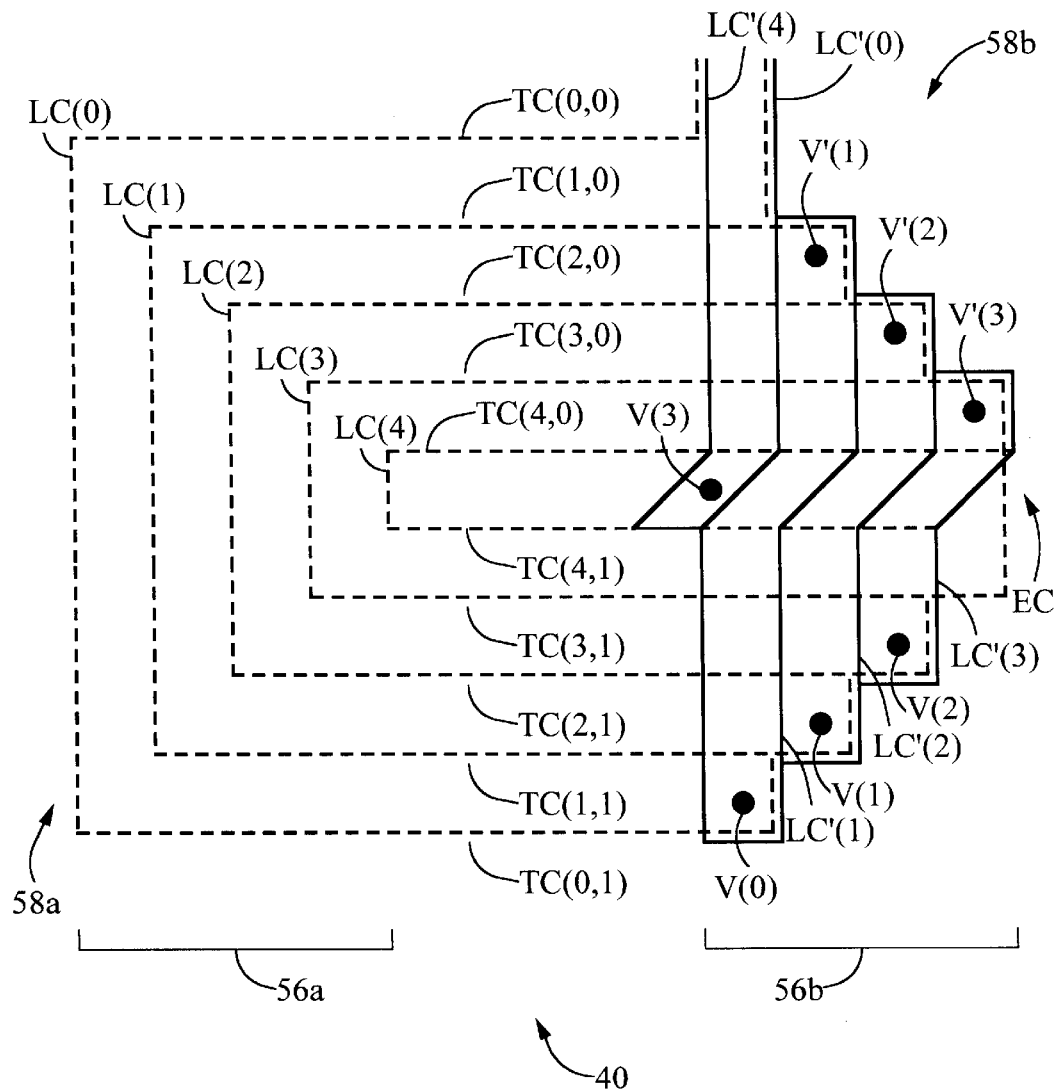
FIG. 1-C

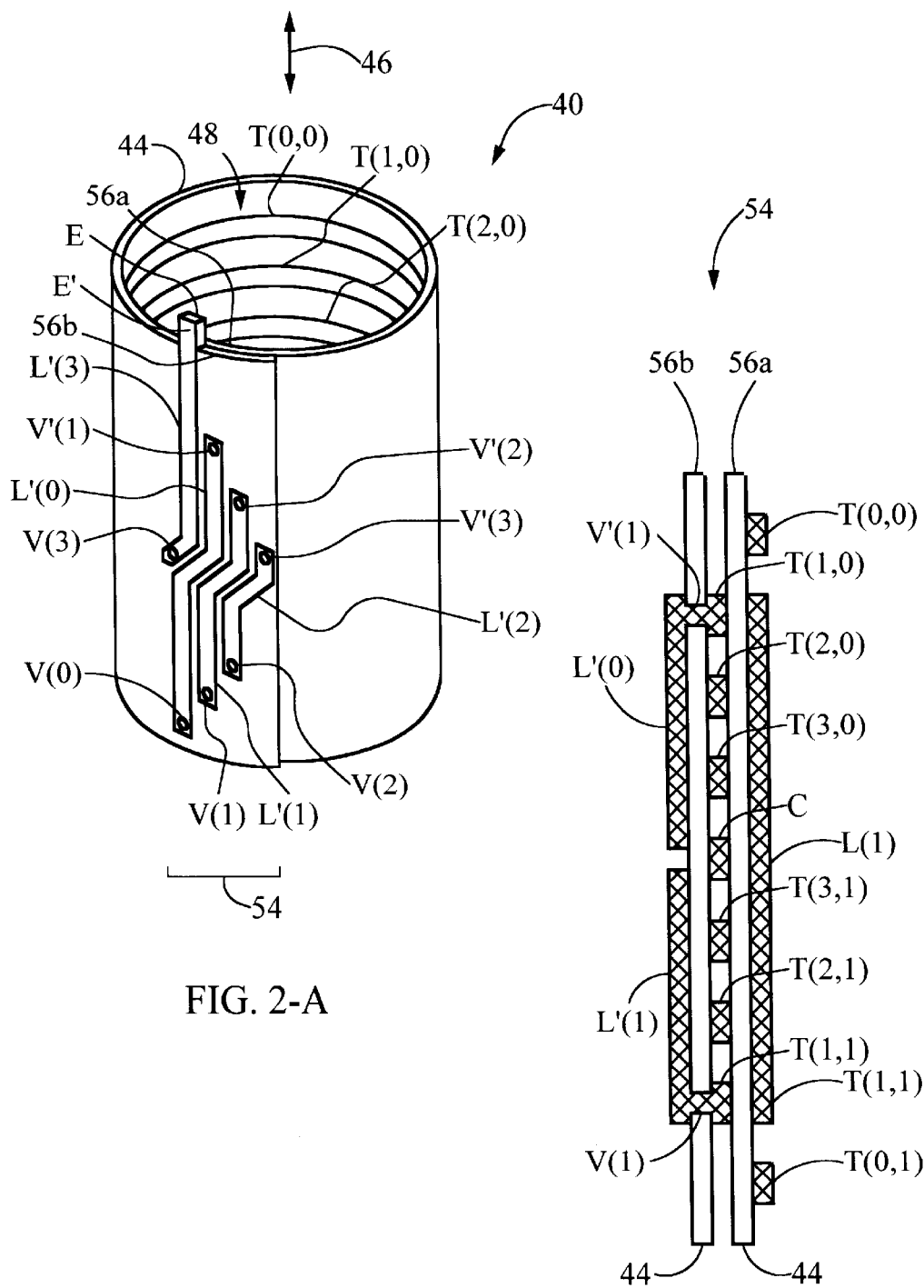
FIG. 2-A
FIG. 2-B

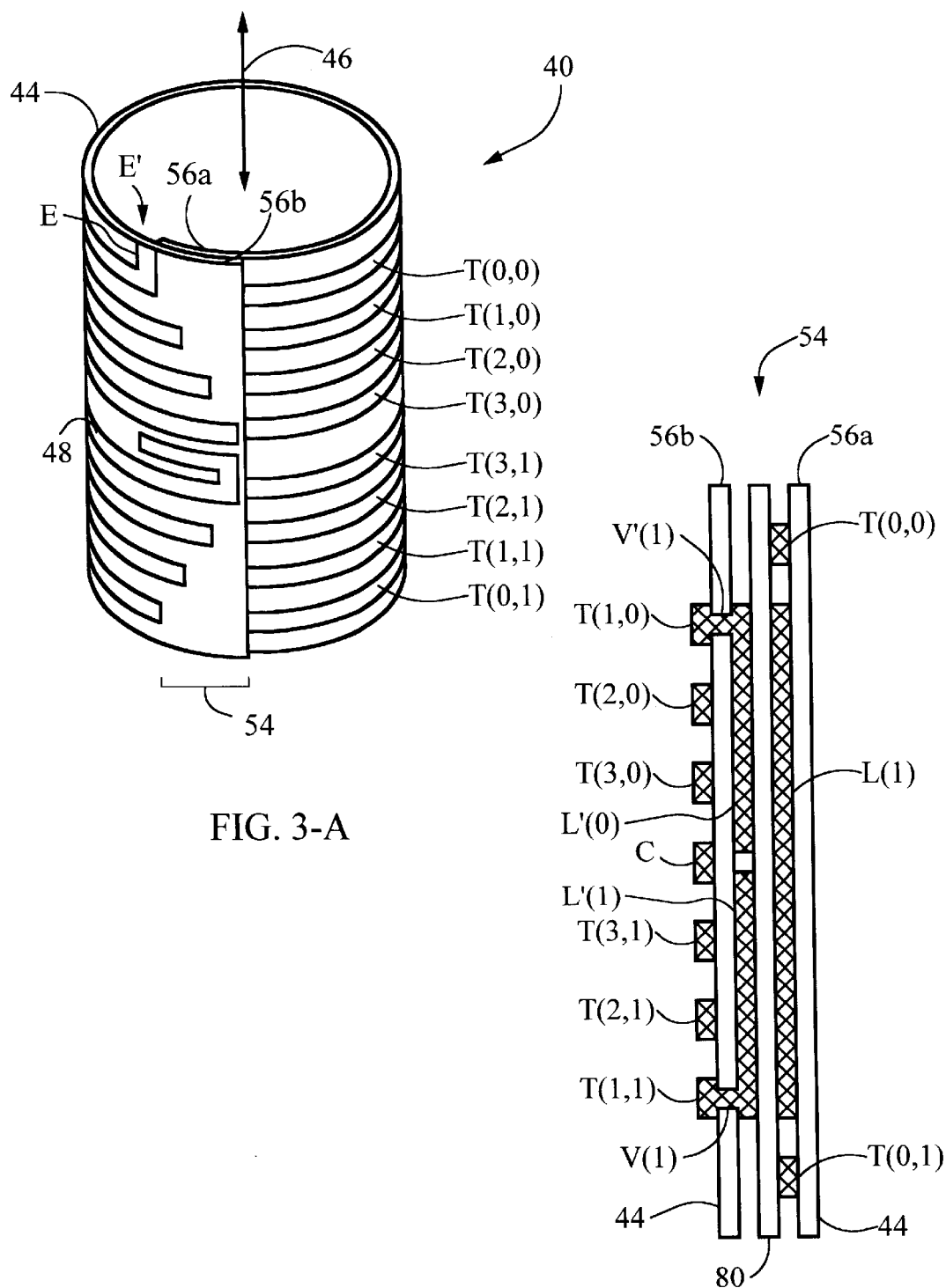
FIG. 3-A
FIG. 3-B

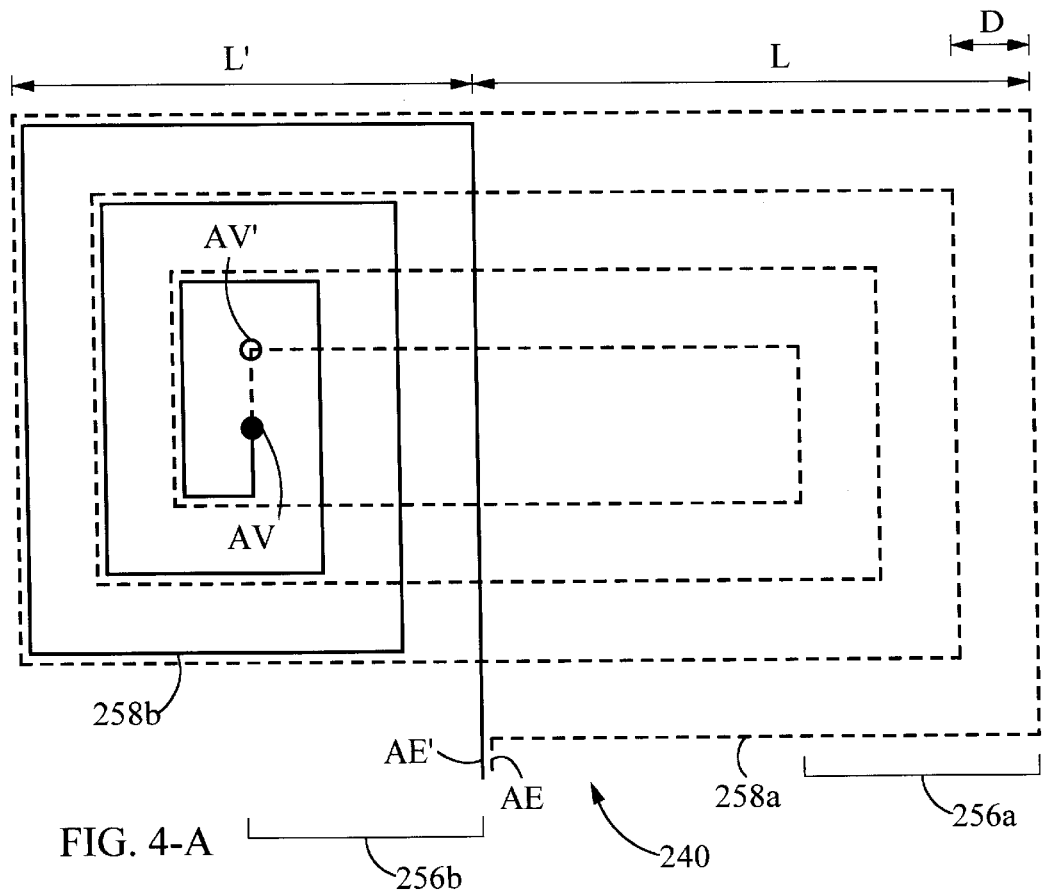
FIG. 4-A
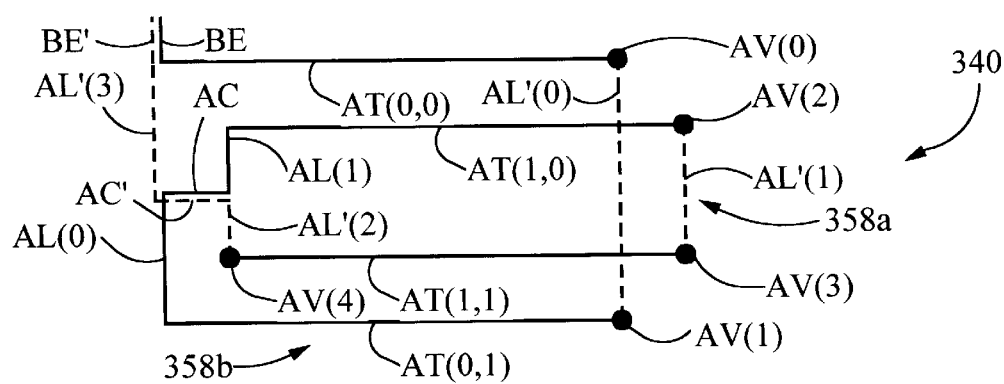
FIG. 4-B

US 6,320,382 B1

ETCHED Z-AXIS GRADIENT COILS FOR MAGNETIC RESONANCE

BACKGROUND OF THE INVENTION

This invention relates to devices and methods for establishing magnetic field gradients, and in particular to etched Z-axis magnetic field gradient coils for magnetic resonance applications such as nuclear magnetic resonance spectroscopy and magnetic resonance imaging.

Nuclear Magnetic Resonance (NMR) and magnetic resonance imaging (MRI) devices often employ a superconducting magnet for generating a static magnetic field $B_0$ along the z-axis, and a special-purpose z-axis gradient coil for generating a magnetic field gradient along the z-axis. It is common notation to label the other two cartesian axes the x- and y-axes, and the angle measured from the x-axis in the x-y plane.

In one prior art approach, a z-axis gradient coil is made by winding wire coils on a cylindrical support, with a predetermined current distribution chosen to generate the desired magnetic field gradient. The predominant direction of the windings is then in the transverse (x-y) plane, with a relatively small component along the z-axis needed to make connections between adjacent turns. The magnetic field generated by the z-axis component of the windings can be canceled out by winding a second layer of turns in the same angular direction but opposite z-direction. While wire coils are capable of generating satisfactory magnetic field gradients, such coils are often relatively expensive to fabricate.

In U.S. Pat. No. 4,910,462, Roemer et al. describe a z-axis gradient coil made by an etched-circuit technique: a conductive pattern is etched onto a flat, flexible sheet and the sheet is rolled into a cylinder. In one suggested design approach (shown in FIG. 2 of Roemer et al.), the coil comprises a two-layer interconnector section that bends back sharply to lie along the cylindrical part of the coil. The sharp bend can generate stresses in the coil material.

Moreover, the interconnector section forms a bulge on the outside of the coil. In another design approach (illustrated in FIGS. 3, 3a and 3b) of Roemer et al.), a two-layer interconnector section lies along the cylindrical part of the coil, without bending sharply. In this approach, however, the z-axis current components in the two interconnector layers have unequal magnitudes, and unwanted current components in the interconnector section are not completely canceled.

In U.S. Pat. No. 5,623,208, Hasegawa describes a z-axis etched-circuit gradient coil formed by winding multiple turns of a flexible substrate on a cylindrical bobbin. As shown in FIG. 2 of Hasegawa, the coil includes a sharp 180° bend along a marginal interconnector region.

SUMMARY OF THE INVENTION

The present invention provides a magnetic field gradient coil for a magnetic resonance probe. The coil comprises an etched double-sided flexible sheet having a conductive pattern defined thereon. The conductive pattern comprises two subpatterns formed on opposite sides of the sheet. At least one via running through the sheet electrically interconnects the two conductive subpatterns.

In the preferred embodiment, the coil is a z-axis magnetic field gradient coil. The conductive pattern comprises transverse leads for generating the z-axis gradient, and longitudinal (z-axis) leads for interconnecting the transverse leads. Each z-axis current lead is adjacent to another z-axis current lead oriented in the opposite direction, such that the net magnetic effect of z-axis current flow through the conductive pattern in negligible. The use of a double-sided sheet with via interconnections allows canceling undesired z-axis currents without sharply bending the sheet.

BRIEF DESCRIPTION OF THE DRAWINGS

FIG. 1-A is a schematic wiring diagram for a preferred magnetic resonance Z-axis gradient coil of the present invention.

FIG. 1-B shows a central part of the wiring diagram of FIG. 1-A.

FIG. 1-C is a schematic insulative cutline diagram corresponding to the wiring diagram of FIG. 1-A.

FIG. 2-A shows an isometric view of a coil configuration corresponding to the wiring diagram of FIG. 1-A.

FIG. 2-B shows a transverse sectional view of an overlap part of the coil of FIG. 2-A.

FIG. 3-A shows an isometric view of another coil configuration corresponding to the wiring diagram of FIG. 3-A.

FIG. 3-B shows a detailed transverse sectional view of an overlap part of the coil of FIG. 3-A.

FIG. 4-A illustrates a wiring diagram for a coil according to an alternative embodiment of the present invention.

FIG. 4-B illustrates a wiring diagram for a coil according to another alternative embodiment of the present invention.

DETAILED DESCRIPTION OF THE INVENTION

In the following description, unless otherwise explicitly stated, the term "coil" is understood to encompass both sheets rolled into cylinders and unrolled, flat sheets capable of being rolled into cylinders. The term "longitudinal" is understood to refer to a direction substantially parallel to the z-axis of the coil. Similarly, the term "transverse" is understood to refer to a direction substantially along a plane perpendicular to the z-axis of the coil. The term "tangential" is understood to refer to a transverse direction substantially parallel to the coil sheet surface.

The following description illustrates embodiments of the invention by way of example and not necessarily by way of limitation.

Typical nuclear magnetic resonance (NMR) spectrometers and magnetic resonance imaging (MRI) devices include a magnet for generating a static magnetic field $B_0$ along the z-axis, and a magnetic resonance probe inserted in a bore of the magnet. The probe holds the sample or object of interest. The probe can further include one or more z-axis gradient coil(s) enclosing the sample of interest, for applying linear or higher-order z-axis magnetic field gradient(s) to the sample. The probe may also include x- and y-axis magnetic field gradient coils. The gradient coils of the probe are in electrical communication with a conventional control system, for running currents through the coils.

FIG. 1-A is a schematic wiring diagram showing the electrical connections of a z-axis magnetic field gradient coil 40 according to the preferred embodiment of the present invention. During its operation, coil 40 is rolled into a cylinder, as described in more detail below. Coil 40 comprises an electrically conductive pattern formed on two sides of a flexible insulative substrate sheet. The coil pattern comprises a first coil subpattern 58a, depicted by dashed lines, formed on one side of the coil sheet, and a second coil subpattern 58*b*, depicted by solid lines, formed on the other side of the coil sheet. For illustrative purposes, solid and dashed lines which are on top of one another are shown as slightly separated. A plurality of vias V(i), V'(k), i=0 . . . 3, k=1 . . . 3, extend through the coil sheet and interconnect subpatterns 58*a*–*b*.

Subpattern 58*a* comprises a plurality of pairs of parallel tangential leads T(i,j), i=0 . . . 3, j=0 . . . 1, for generating a z-axis magnetic field gradient, a plurality of longitudinal leads L(i) for interconnecting tangential leads T(i,j), a central interconnection lead C, and an external interconnection lead or contact E for providing contact to external circuitry. The index i denotes the identity of each pair of tangential leads, while the index j denotes the identity of each lead within a pair. Tangential leads T(i,j) generate a magnetic field gradient along a longitudinal direction 46 of coil 40. Longitudinal direction 46 corresponds to the magnetic field z-axis.

The tangential leads T(i,j) of each pair are disposed, along the longitudinal (z) direction, symmetrically and opposite each other with respect to the central z=0 plane passing through the center of coil 40. Each pair of leads T(i,j), i≠3, longitudinally encloses an adjacent pair of leads T(i+1j).

Each tangential lead T(i,j) extends over a length L=2n R, where n is an integer (e.g. n=1) denoting the number of coil sheet turns, and R is the radius of coil 40 in its cylinder-shaped operating configuration. Typical values for the radius R are on the order of a cm for NMR and up to tens of cm for MRI. The tangential start and end positions of each pair of leads T(i,j) are separated from the start and end positions of the adjacent pair(s) of leads T(i,j) by a distance D. The distance D is sufficient to accommodate each longitudinal lead L(i). Typical values for the distance D are on the order of a mm.

The start and end positions of leads T(i,j) lie along opposite transverse end regions 56*a*–*b* of coil 40, respectively. Tangential leads T(i,j) extend generally between end regions 56*a*–*b*. When coil 40 is rolled in its cylindrical operating configuration, the start and end positions of each lead T(i,j) are adjacent, and separated only along the radial direction.

Longitudinal leads L(i) extend longitudinally along end region 56*a*. Each longitudinal lead L(i) extends between and interconnects two longitudinally-aligned ends of a corresponding pair of tangential leads T(i,j). Adjacent longitudinal leads L(i) are transversely separated (center-to-center) by distance D. Leads L(i) are progressively shorter for increasing i, from a longest outer lead L(0) to a shortest inner lead L(3).

Transverse leads T(i,j) and longitudinal leads L(i) form a plurality of sequentially-enclosed U-shaped conductive subpatterns, from an outer subpattern defined by leads T(0,0), L(0), and T(0,1), to an inner subpattern defined by leads T(3,0), L(3) and T(3,1). Each subpattern corresponding to an index i≠0 is enclosed by the adjacent subpattern corresponding to i−1.

External contact E is connected to the end of lead T(0,0) situated opposite longitudinal lead L(0). External contact E is the contact point between coil 40 and an external current source used to drive coil 40. Central lead C is electrically connected to transverse lead T(3,1), at the end of transverse lead T(3,1) opposite longitudinal lead L(3). Central lead C extends substantially tangentially, along transverse end region 56*b*. Central lead C runs from the end of transverse lead T(3,1) opposite lead L(3) to a via V(3). Via V(3) is tangentially aligned with the ends of leads T(0,0), T(0,1) opposite lead L(0).

A plurality of vias V(i), i=0 . . . 3, and V'(k), k=1 . . . 3, are defined along transverse end region 56*b*. Each via V(i), V'(k) is situated at an end of a tangential lead T(i,j) opposite longitudinal leads L(i), except for via V(3) which is positioned at an end of central lead C. Vias V(i), i=0 . . . 2, are connected to tangential leads T(i,1), respectively. Vias V'(k), k=1 . . . 3, are connected to tangential leads T(k,0), respectively.

Subpattern 58*b* comprises a plurality of generally longitudinal leads L'(i), i=0 . . . 3. Each lead L'(i), i=0 . . . 2, interconnects corresponding vias V(i) and V'(i+1). Lead L'(3) is connected at one end to via V(3), and at the other end includes an external contact region E' for connecting to outside circuitry. Contact E' is situated opposite contact E, on the other side of the sheet. Leads L'(i) extend along transverse end region 56*b*.

Each lead L'(i) includes at least a part situated a tangential distance L=2n R away from a corresponding part of a lead L(i), such that leads L'(i) are adjacent and oriented opposite to leads L(i) when coil 40 is rolled into its cylinder-shaped operating configuration. Consequently, the transverse (x-y) magnetic field generated by longitudinal current flow through leads L(i) is substantially canceled by a magnetic field of equal magnitude and opposite direction generated by longitudinal current flow through leads L'(i).

Leads L'(i), i=0 . . . 2, further include corresponding central parts C'(i), as shown in FIG. 1-B. Each central part C'(i) has a tangential component which is adjacent to central lead C, such that the z-axis magnetic field produced by current flow through central lead C is substantially canceled by the z-axis magnetic field produced by current flow through leads L'(i).

Referring back to FIG. 1-A, coil 40 in its cylindrical configuration is connected to outside circuitry through contacts E, E'. Current flows through contact E, around a loop through tangential lead T(0,0), then longitudinally through lead L(0), and again back around a loop through tangential lead T(0,1). Current then passes through via V(0), longitudinal lead L'(0), and via V'(1) before flowing again tangentially through lead T(1,0). The tangential direction of current flow through lead T(0,0) is opposite to that through lead T(0,1). Similarly, the longitudinal direction of current flow through lead L'(0) is opposite to that through lead L(0). The current flow then continues as described above, sequentially through the rest of the leads and vias to external contact E'.

As is apparent from the above description, coil 40 generates a z-axis magnetic field gradient without generating undesired transverse (x-y) magnetic field components. All longitudinal lead parts are adjacent to complementary longitudinal lead parts of opposite current direction. Similarly, all tangential lead parts not needed for generating the z-axis magnetic field gradient are adjacent to tangential lead parts of opposite current orientation. The net current flow through coil 40 is that through tangential leads T(i,j).

The electrical connections of coil 40 are preferably formed by etching insulative cutlines into a double-sided flexible sheet coated with a conductive material such as copper. FIG. 1-C schematically illustrates a preferred insulative cutline diagram for coil 40, corresponding to the electrical connections of FIG. 1-A.

As shown in FIG. 1-C, the boundaries of subpattern 58*a* are defined by a plurality of tangential insulative cutlines TC(i,j), i=0 . . . 4, j=0 . . . 1, a plurality of longitudinal insulative cutlines LC(i), i=0 . . . 4, and an edge cutline EC formed transversely opposite cutlines LC(i). Similarly, the boundaries of subpattern 58*b* are defined by a plurality of generally longitudinal cutlines LC'(i), i=0 . . . 4, formed on a side of the coil sheet opposite subpattern 58*a*. Vias V(i), V'(k), i=0 . . . 3, k=1 . . . 3, are formed in the space between the cutlines defining subpatterns 58*a–b*.

FIG. 2-A shows an isometric view of coil 40 in one cylinder-shaped operating configuration of the present invention. Coil 40 is formed by a flexible patterned sheet rolled into a cylinder. The longitudinal central axis 46 of the cylinder coincides with the magnetic field z-axis. The transverse plane perpendicular to longitudinal axis 46 coincides with the x-y plane of the magnetic field. The patterned sheet comprises a flexible insulative substrate sheet 44, and a z-axis gradient conductive coil pattern 48 formed on the substrate sheet. A desired z-axis magnetic field gradient is generated by running current through coil pattern 48. In the configuration of FIG. 2-A, tangential leads T(i,j) are formed on the internal cylinder surface, while longitudinal leads L'(i) are formed on the external cylinder surface. An overlap region 54 is defined by the adjacent transverse end regions 56*a–b*. End contacts E and E' extend longitudinally outside of the cylindrical portion of coil 40, to allow access to contacts E and E'.

FIG. 2-B shows a longitudinal cross-sectional view of overlap region 54, along a cross-section passing through longitudinal leads L'(0) and L'(1). Conductive leads are hatched. For clarity of presentation, both FIGS. 2-A and 2-B show only active conductive regions—regions through which current passes. Coil 40 may also include unetched passive conductive regions (not shown), electrically insulated from the current path of coil 40 and from external circuitry. As illustrated, end 56*b* overlaps and is substantially radially adjacent to end 56*a* along overlap region 54. Substrate sheet 44 separates longitudinal lead L(1) from the parts of longitudinal leads L'(0), L'(1) which are radially adjacent to lead L(1). The magnetic field produced by current flowing through lead L(1) is substantially canceled by current flowing in the opposite direction through leads L'(0), L'(1) along lead L(1).

In the configuration shown in FIG. 2-B, the conductive material along the external side of end 56*a* (the side opposite longitudinal lead L(1)) has been etched away, so that leftover passive conductive material does not provide an undesired shorting path between the transverse leads T(i,j), i=1 . . . 3, j=0 . . . 1, defined along end 56*b*. Alternatively, an additional flexible insulative sheet may be attached between ends 56*a–b*, for electrically insulating transverse leads T(i,j) from a potential conductive surface along end 56*a*.

FIG. 3-A shows an isometric view of coil 40 in another operating configuration of the present invention, in which tangential leads T(i,j) are formed on the external cylinder surface and longitudinal leads L'(i) are formed on the internal cylinder surface. End region 56*a* may include a corner opening for providing access to contact E defined along end region 56*b*, opposite contact E', such that end region 56*a* does not cover contact E. Alternatively, contacts E and E' may extend longitudinally outside of the cylindrical portion of coil 40.

FIG. 3-B shows a longitudinal cross-sectional view of overlap region 54, along a cross-section passing through longitudinal leads L'(0) and L'(1). As described above, lead L(1) is radially adjacent and oriented opposite to parts of leads L'(0) and L'(1). A flexible insulative sheet 80 is disposed along overlap region 54, between end regions 56*b* and 56*a*, for electrically insulating longitudinal leads L(i) from longitudinal leads L'(i). If contacts E and E' are formed along the cylindrical part of coil 40, sheet 80 may include a corner opening for providing external access to contact E. The configuration of FIGS. 3-A and 3-B allows reducing the radial distance between leads L(i) and L'(i), relative to the configuration of FIGS. 2-A and 2-B.

In the preferred embodiment, a coil of the present invention is made by defining vias through a double-sided flexible printed circuit sheet, patterning a Z-axis gradient pattern on the sheet, and rolling the patterned sheet into a cylindrical coil configuration. An initially-unpatterned double-sided coil sheet comprises a flexible, insulative (dielectric) substrate sheet, and two conductive sheets adhered or mounted on opposite major sides of the substrate sheet. The conductive sheets can be formed by a metal such as copper. Double-sided unpatterned sheets are well-known and commercially available.

Via apertures are defined through all three layers of the unpatterned sheet. The via apertures can be formed by drilling or using a laser. The resulting sheet is plated in a bath of a conductive material, e.g. copper. The plated conductive material adds thickness to the original conductive sheets, and also deposits along the side walls of the via apertures. The conductive material deposited through the via apertures forms the coil vias, and establishes electrical contact between the opposite conductive sheets through the insulative substrate sheet.

The conductive pattern of the coil is then defined on both sides of the sheet. Preferably, photoresist is deposited on both sides of the sheet. The photoresist is selectively hardened by exposure to light along the areas which are to define the conductive patterns. The unexposed photoresist is then washed away, and the conductive material unprotected by remaining hardened photoresist is removed in an etch bath. The hardened photoresist can be removed from the coil after the conductive patterns are defined. The resulting patterned sheet is rolled into a cylinder and the transverse end regions are adhered to one another, possibly with an insulative sheet in between. The external coil contacts are electrically connected to by outside circuitry, and the coil is mounted within a magnetic resonance device/probe.

FIG. 4-A illustrates a coil wiring diagram for a z-axis gradient coil 240 according to an alternative embodiment of the present invention. Coil 240 is rolled into a cylinder in its operating configuration. Coil 240 includes a conductive pattern defined on two sides of a flexible insulative substrate sheet. Coil 240 includes a first conductive subpattern 258*a* formed on one side of the substrate sheet, and a second conductive subpattern 258*b* formed on the other side of the substrate sheet, opposite subpattern 258*a*. Subpattern 258*a* is illustrated by dashed lines while subpattern 258*b* is depicted by solid lines. A via AV extends through the substrate sheet, and interconnects subpatterns 258*a–b*. Via AV is the only interconnection between subpatterns 258*a–b*.

Subpattern 258*a* has the shape of an orthogonal spiral, and includes plural tangential and longitudinal leads. The longitudinal leads are orthogonal to the tangential leads. Subpattern 258*a* extends over a tangential length L+L', where L=2n R is the length of an integer number n of coil turns of radius R, and L' is an overlap region length. Adjacent longitudinal leads are separated by a distance D. The difference in length between adjacent tangential leads is 2D. The internal end of the spiral of subpattern 258*a* is located at via AV, while the external end of the spiral forms or is connected to an external contact AE.

Subpattern 258*b* also has the shape of an orthogonal spiral, and includes plural tangential and longitudinal leads. The external end of the spiral forms or is connected to an external contact AE'. Subpattern 258b extends over a tangential length L', and overlaps subpattern 258a. Each tangential lead of subpattern 258b is radially adjacent and has an opposite current direction to a part of a corresponding tangential lead of subpattern 258a. The length of each tangential lead of subpattern 258b is equal to the extent over L of the corresponding tangential lead of subpattern 258a, such that the net tangential lead length for coil 240 at each longitudinal position z is equal to L.

An end region 256b is adjacent to and overlaps an end region 256a. The longitudinal leads of subpattern 258a along end region 256a are separated by a tangential distance L from the longitudinal leads of subpattern 258b along end region 256b. The difference in tangential extents (lengths) of subpatterns 258a–b is equal to the tangential extent L. When coil 240 is in its cylindrical configuration, the longitudinal leads of subpattern 258a along end region 256a are adjacent and oppositely oriented to the longitudinal leads of subpattern 258b along end region 256b.

Current flows from contact AE, from the external end of the spiral of subpattern 258a, sequentially through the leads of subpattern 258a until the internal end of the spiral of subpattern 258a. Current then flows through via AV to the other side of the coil sheet, to the internal end of the spiral of subpattern 258b. From the internal end of subpattern 258b, current flows in an external direction, sequentially through the leads of subpattern 258b to the external end of the spiral of subpattern 258b and contact AE'. Contacts AE and AE', and the external ends of the two spirals are adjacent.

As described above for coil 40 (shown in FIG. 1-A), all leads producing undesired magnetic fields are adjacent to leads of opposite current direction situated on the other sheet side or along another turn of the same sheet side. The current through each pair of corresponding tangential and longitudinal leads of coil 240 flows in opposite directions, such that the tangential leads generate a z-axis magnetic field gradient while the longitudinal leads generate a net magnetic field approaching zero.

FIG. 4-A illustrates an alternative via AV' interconnecting subpatterns 258a–b. Via AV' may be used instead of via AV, in order to provide for improved cancellation of longitudinal currents. For via AV, the longitudinal current flow in subpattern 258a can narrow into via AV, and then broaden away from via AV in subpattern 258b. The non-uniform current flow through the longitudinal leads going in and out of via AV then does not exactly cancel the magnetic effects of the corresponding, radially-adjacent uniform current flowing in the opposite direction. Since current flow naturally narrows in corner regions, using via AV' instead of via AV may allow more closely matching the longitudinal current distributions in radially-adjacent coil layers.

FIG. 4-B shows a wiring diagram for a z-axis gradient coil 340 according to another alternative embodiment of the present invention. Coil 340 comprises a first conductive subpattern 358a (dashed lines) formed on one side of a flexible insulative substrate sheet, a second conductive subpattern 358b (solid lines) formed on the opposite side of the substrate sheet, and a plurality of vias AV(i), i=0 . . . 4, interconnecting pattern 358a–b. Subpattern 358a comprises a plurality of longitudinal leads AL'(i), i=0 . . . 3 a central tangential lead AC', and an external contact BE'. Subpattern 358b comprises a plurality of tangential leads AT(i,j), i=0 . . . 1, j=0 . . . 1, a plurality of longitudinal leads AL(k), k=0 . . . 1, a central tangential lead AC, and an external contact BE.

As FIG. 4-B illustrates, the use of vias provides considerable freedom in designing the subpatterns on both sides of the coil, while allowing the cancelation of unwanted transverse (x-y) magnetic fields. The vias provide means for current paths to cross without coming in contact. The use of a rolled printed circuit board with overlapping ends provides a region along which the undesirable effects of longitudinal currents can be compensated for by radially-adjacent, opposing currents. A configuration of the present invention can be used to generate any rotationally-invariant z-axis magnetic field gradient. The gradients are generated by transverse current paths. The effective (net) longitudinal current paths, which could distort the desired field gradients, are eliminated.

It will be clear to one skilled in the art that the above embodiments may be altered in many ways without departing from the scope of the invention. Generally, many other wiring diagrams and configurations may be used in the present invention. For example, a coil of the present invention may be used to generate x- or y-axis magnetic field gradients. X- and y-axis magnetic field gradients are shaped as pairs of figures-8, and are not necessarily subject to the same topological constraints as z-axis coils. Accordingly, the scope of the invention should be determined by the following claims and their legal equivalents.

What is claimed is:

1. A coil for producing a z-axis magnetic field gradient for magnetic resonance analysis, comprising:
   a) a flexible insulative substrate sheet formed by monotonic flexure to produce a lateral surface spaced about said Z-axis;
   b) a first conductive z-axis gradient coil pattern formed on said substrate sheet, comprising
      a plurality of pairs of tangential leads for generating said z-axis magnetic field gradient, and
      a plurality of first longitudinal leads interconnecting said tangential leads;
   c) at least one conductive via extending through said substrate sheet and electrically connected to said first coil pattern; and
   d) a second conductive coil pattern formed on said substrate sheet on a side opposite said first pattern, said second coil pattern being electrically connected to said at least one conductive via and comprising a plurality of second longitudinal leads positioned to substantially cancel a magnetic field produced by said plurality of first longitudinal leads.

2. The coil of claim 1 wherein:
   a) said first pattern comprises a first transverse end region, said plurality of first longitudinal leads being formed along said transverse end region; and
   b) said second pattern comprises a second transverse end region overlapping said first transverse end region and situated radially-adjacent to said first transverse end region, said plurality of second longitudinal leads being formed along said second transverse end region.

3. The coil of claim 1 wherein:
   a) said first pattern forms a first orthogonal spiral extending tangentially for more than one turn of said sheet; and
   b) said second pattern forms a second orthogonal spiral extending in an opposite direction along a part of said first pattern, said part of said first pattern extending tangentially for a difference between a tangential extent of said first pattern and a tangential extent of an integer number of turns of said sheet.

4. A coil for producing a Z-axis magnetic field gradient for magnetic resonance analysis, comprising:
   a) a flexible insulative substrate sheet formed by monotonic flexure to produce a lateral surface spaced about said Z-axis; and
   b) a conductive z-axis gradient coil pattern formed on said sheet, said coil pattern comprising an external gradient coil subpattern formed on an external side of said sheet, an internal gradient coil subpattern formed on an internal side of said sheet, and a via interconnection connecting said external subpattern and said internal subpattern.

5. A method of fabricating a Z-axis magnetic field gradient coil for magnetic resonance analysis, comprising the steps of:
   a) forming a first conductive z-axis gradient coil pattern on a first side of a double-sided flexible coil sheet, and a second conductive z-axis gradient coil pattern on a second side of said coil sheet;
   b) forming at least one via through said sheet, said via electrically connecting said first pattern and said second pattern; and
   c) monotonically rolling said sheet into a cylinder.

6. The method of claim 5, wherein said forming said first coil pattern and said second pattern comprises the steps of:
   a) etching a plurality of insulative cutlines on said first side, for defining said first coil pattern; and
   b) etching a plurality of insulative cutlines on said second side, for defining said second coil pattern.

* * * * *